United States Patent [19]

Farb et al.

[11] Patent Number: 5,260,227

[45] Date of Patent: Nov. 9, 1993

[54] METHOD OF MAKING A SELF ALIGNED STATIC INDUCTION TRANSISTOR

[75] Inventors: Joseph E. Farb, Riverside; Kuan Y. Liao, Laguna Niguel; Maw-Rong Chin, Huntington Beach, all of Calif.

[73] Assignee: Hughes Aircraft Company, Los Angeles, Calif.

[21] Appl. No.: 981,032

[22] Filed: Nov. 24, 1992

[51] Int. Cl.$^5$ .......................................... H01L 21/265
[52] U.S. Cl. ....................................... 437/41; 437/38; 437/203; 437/911
[58] Field of Search ............. 437/41, 40, 38, 911, 437/203, 6; 148/DIG. 88

[56] References Cited

U.S. PATENT DOCUMENTS

| | | | |
|---|---|---|---|
| 4,543,706 | 10/1985 | Bencuya et al. | 437/911 |
| 4,566,172 | 1/1986 | Bencuya et al. | 437/38 |
| 4,611,384 | 9/1986 | Bencuya et al. | 437/911 |
| 4,713,358 | 12/1987 | Bulat et al. | 437/911 |
| 5,082,795 | 1/1992 | Temple | 437/203 |
| 5,143,859 | 9/1992 | Harada | 437/911 |
| 5,164,325 | 11/1992 | Cogan et al. | 437/203 |
| 5,169,795 | 12/1992 | Nishizawa et al. | 437/203 |

FOREIGN PATENT DOCUMENTS

| | | | |
|---|---|---|---|
| 2143564 | 6/1990 | Japan | 437/911 |
| 2189978 | 7/1990 | Japan | 437/911 |

OTHER PUBLICATIONS

"Static Induction Transistors Optimized for High-Voltage Operation and High Microwave Power Output", I. Bencuya et al., IEEE Transaction on Electron Devices, vol. ED-32, No. 7, Jul. 1985.

"Effects of Shielded-Gate Structure on On-Resistance of the SIT with High-Purity Channel Region", K. Yano et al., IEEE Transaction on Electron Devices, vol. ED-39, No. 5, Jul. 1992.

*Primary Examiner*—Brian E. Hearn
*Assistant Examiner*—Michael Trinh
*Attorney, Agent, or Firm*—Elizabeth E. Leitereg; Terje Gudmestad; W. K. Denson-Low

[57] ABSTRACT

A method of fabricating self aligned static induction transistors. The method comprises fabricating an N silicon on N$^-$ silicon substrate having an active area. A guard ring is formed around the active area. An N+ polysilicon layer is formed that comprises source and gate regions. An oxide layer is formed on the N+ polysilicon layer. A second polysilicon layer is formed on the oxide layer. A second oxide layer is formed on the second polysilicon layer which is then masked by a self aligning mask. Trenches are etched into the substrate using the self aligning mask and gate regions are formed at the bottom of the trenches. A first layer of metal (gate metal) is deposited to make contact with the gate regions. A layer of photoresist is deposited and planarized, and the first layer of metal is overetched below the top surface of the trench. Plasma nitride is deposited and planarized, and a polysilicon mask is deposited over the planarized layer of plasma nitride. The polysilicon mask is etched to expose the gate metal disposed on the field. A second layer of metal is deposited to make contact with the source and gate regions. A passivation layer is formed, and interconnection pads are formed that connect the first and second layers of metal. The present method employs a single minimum geometry trench mask. The key features of the transistor are defined by the trench mask and related processing parameters. Because of the self alignment achieved by the present invention, the number of channels per unit area is higher, which results in higher transconductance. In addition, some of the parasitic capacitance is eliminated by the present invention, resulting in faster operational speed. The variable sidewall trench oxide thickness allows fabrication of static induction transistors with higher or lower breakdown voltages according to the thickness that is chosen, and for a more graded P gate junction.

7 Claims, 7 Drawing Sheets

METHOD OF MAKING A SELF ALIGNED STATIC INDUCTION TRANSISTOR

BACKGROUND

The present invention relates to semiconductor transistors, and more particularly, to a method of making self aligned static induction transistors.

The prior art relating to static induction transistors are described in "Static Induction Transistors Optimized for High-Voltage Operation and High Microwave Power Output", by Izak Bencuya, et al., published in IEEE Transactions on Electron Devices, Vol. ED-32, No. 7, Jul. 1985, and "Effects of Shielded-Gate Structure on On-Resistance of the SIT with a High-Purity Channel Region", by Koji Yano, et al. published in IEEE Transactions on Electron Devices, Vol. ED-39, No. 5, Jul. 1992, for example. Prior art static induction transistors, such as those discussed in these references are not self aligned and are therefore slower for a given power and/or voltage level.

It is therefore an objective of the present invention to provide for a method of making self aligned static induction transistors.

SUMMARY OF THE INVENTION

In accordance with these and other objectives, the present invention provides for a method of fabricating self aligned static induction transistors. The method is comprised of the following steps. Fabricating an N silicon on N⁻ silicon substrate. Forming an active area on the substrate. Forming a guard ring surrounding the active area. Forming an N+ polysilicon layer having an N+ layer adjacent the substrate that comprises source and gate regions of the transistor. Forming an oxide layer on top of the N+ polysilicon layer. Forming a second polysilicon layer on top of the oxide layer. Forming an oxide layer on top of the second polysilicon layer. Forming a self aligning mask on the second oxide layer. Forming trenches in the substrate using the self aligning mask. Forming gate regions at the bottom of the trenches. Depositing a first layer of metal to make contact with the gate regions. Depositing and planarizing a layer of photoresist on the surface of the transistor. Overetching the first layer of metal to a predetermined depth below the top surface of the trenches. Depositing and planarizing a layer of plasma nitride on the surface of the transistor. Forming a polysilicon mask over the planarized layer of plasma nitride. Etching the top surface of the nitride and polysilicon to expose the first layer of metal in the gate regions. Depositing a second layer of metal on top of the transistor to make contact with the source and gate regions. Depositing a passivation layer on top of the transistor. Forming interconnection pads that connect to the first and second layers of metal.

The present method employs only one minimum geometry mask, namely the trench mask. All of the key features of the transistor are defined by the trench mask and related processing parameters. Because of the self alignment achieved by the present invention, the number of channels per unit area is higher, which results in higher transconductance. In addition, some of the parasitic capacitance normally found in static induction transistors is also eliminated by the present invention. The static induction transistors produced by the present invention are faster and handle more power than their non-self aligned counterparts.

One important feature of the present invention is the variable sidewall trench oxide thickness. This allows fabrication of static induction transistors with higher or lower breakdown voltages according to the thickness that is chosen. Thicker oxides allow for a more graded P gate junction. Furthermore, by providing a relatively thick N+ polysilicon layer allows for overetching of the first layer or metal, which provides for control of parasitic capacitance and resistance characteristics of the transistor.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
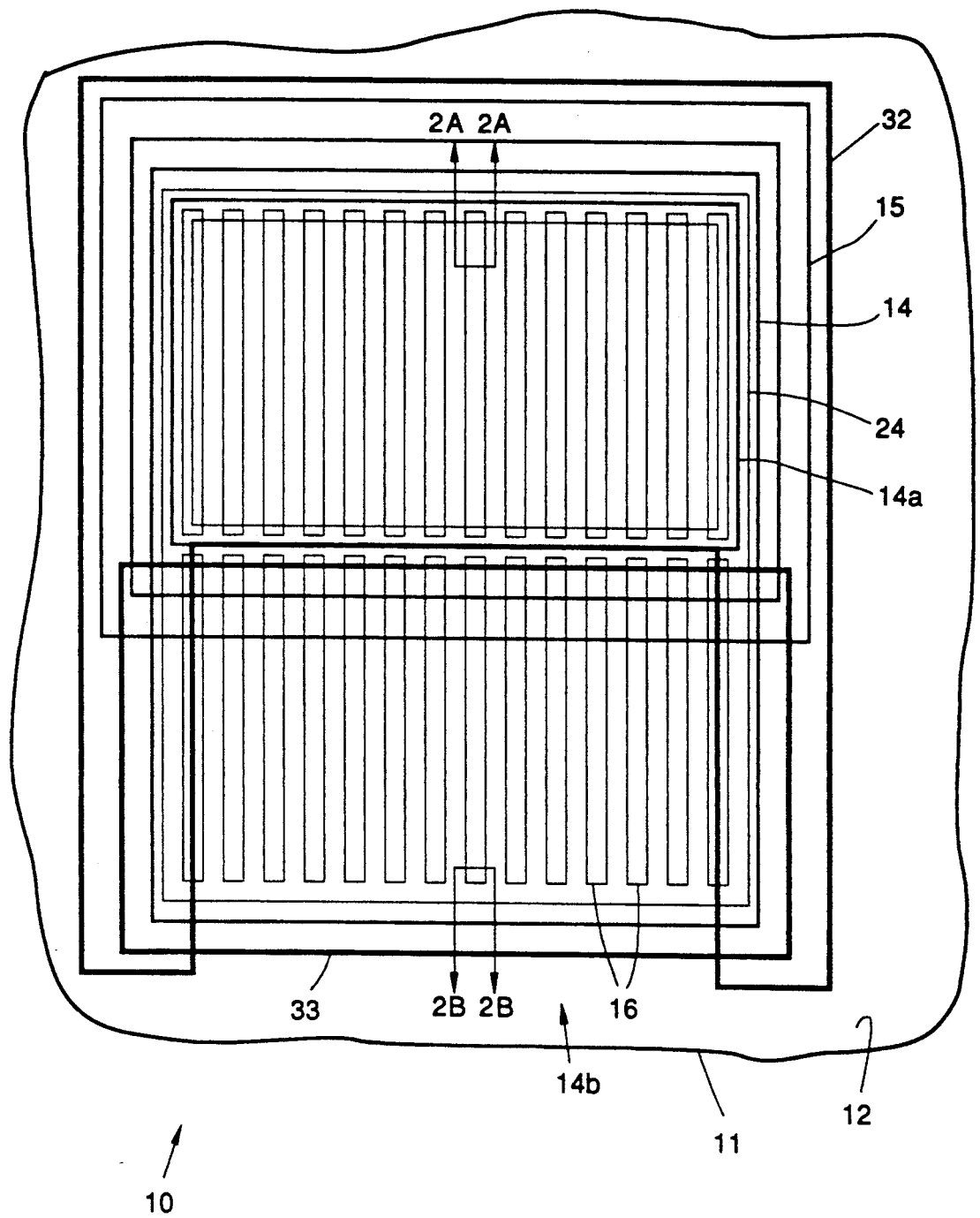
FIG. 1 shows an exposed top view of a static induction transistor made in accordance with the present invention.

Referring to the drawing figures, FIG. 1 shows an exposed top view of a representation of a self aligned static induction transistor 10 made in accordance with a processing method 40 (FIG. 12) of the present invention. FIGS. 2-11 show relevant steps in the processing method 40 that produces the self aligned static induction transistor 10.

With reference to FIG. 1, it shows an N+ silicon substrate 11 having an epitaxial layer of N silicon 12 on a top surface thereof. A guard ring 15 is shown surrounding an active area 14a (stippled area) of the transistor 10. The active area 14a is derived from etching a larger active area 14 which is reduced in size by the etching procedure. A P+ trench 21 is shown having relatively long, narrow strips comprising an N+ polysilicon layer 16 that are the source and gate regions of the transistor 10. Also shown are a polysilicon mask 32 and a prepad mask 33 that will be described below with reference to the processing steps in the present method 40.

Figure 2:
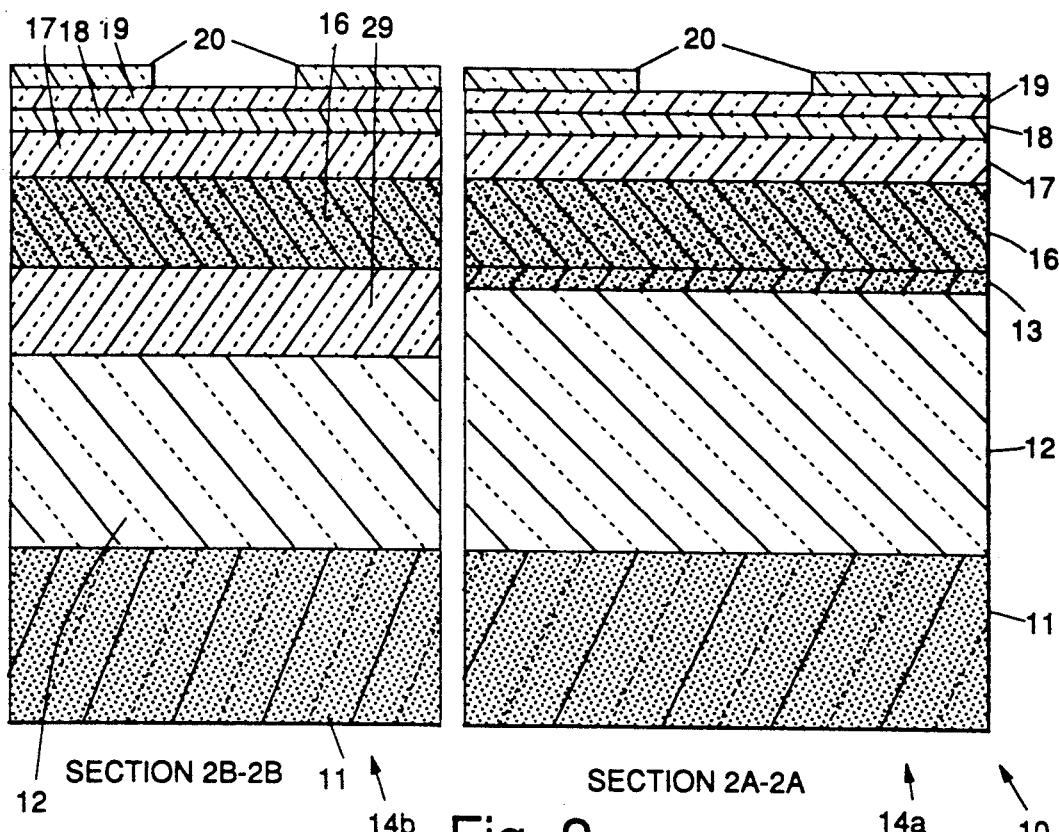
FIGS. 2-11 show the relevant steps in a processing method of the present invention and a cross section of the resulting self aligned static induction transistor.

Referring to FIGS. 2-11, the process flow the processing method 40 is as follows. FIGS. 2-11 show cross sections, taken along the lines 2A-2A (in the active area 14a) and 2B-2B (in field region 14b) in FIG. 1, during the processing method 40. In FIG. 2, the N+ silicon substrate 11 is processed to grow the epitaxial layer of N silicon 12 on the top surface thereof. The N+ silicon substrate 11 comprises a drain (or drain region) of the transistor 10. Then, a thermal oxide layer comprising a pad oxide (not shown) is grown on top of the epitaxial layer of N silicon 12, and a silicon nitride layer 13 is deposited onto the thermal oxide layer. An active area mask (not shown) is then deposited on top of the silicon nitride layer 13. The active area 14 is etched through the nitride layer 13 using the active area mask. The active area mask is then removed.

A guard ring mask (not shown) is then formed over the top surface of the transistor 10. The guard ring 15 is implanted around the active area 14 of the transistor 10 through the guard ring mask. A field oxide layer 29 is then grown over the top surface of the field region 14b, which shrinks the active area 14 to a smaller size, indicated by the active area 14a (shown stippled in FIG. 1). The nitride layer 13 is then stripped. The above processing steps are generally performed in fabricating conventional self aligned static induction transistors 10.

In accordance with the present invention, an undoped polysilicon layer is then deposited on top of the transistor 10 after the nitride layer 13 pad oxide layer have been stripped. The undoped polysilicon layer is deposited to a thickness of 1 or more microns. The undoped polysilicon layer is then implanted with N+ dopant ions to produce an N+ polysilicon layer 16, and an N+ nitride layer 13 adjacent the substrate 11. The N+ polysilicon layer 16 subsequently becomes source and gate regions of the transistor 10. A relatively thick N+ polysilicon layer 16 is provided and allows for subsequent overetching of gate metal, as will be described below. This provides for control of parasitic capacitance and resistance characteristics of the transistor 10.

Thermal oxide is then grown over the N+ polysilicon layer 16 to a thickness on the order of 500 Å, and additional oxide is deposited on top of the thermal oxide to a thickness of about 4000 Å to form a relatively thick oxide layer 17. A second layer of polysilicon 18 is deposited on top of the thermal oxide layer 17 using a low temperature deposition procedure. The second layer of polysilicon 18 is typically on the order of 3000 Å thick. Then, a high temperature dry oxidation procedure is employed to form a second oxide layer 19 on top of the second layer of polysilicon 18. The second oxide layer 19 is typically on the order of 600 Å thick. A back etch procedure is then used to remove the second layer of polysilicon 18 and the relatively thick oxide layer 17 prior to subsequent processing off the back of the wafer. The back etch procedure may use plasma or a wet etch, for example.

Figure 3:
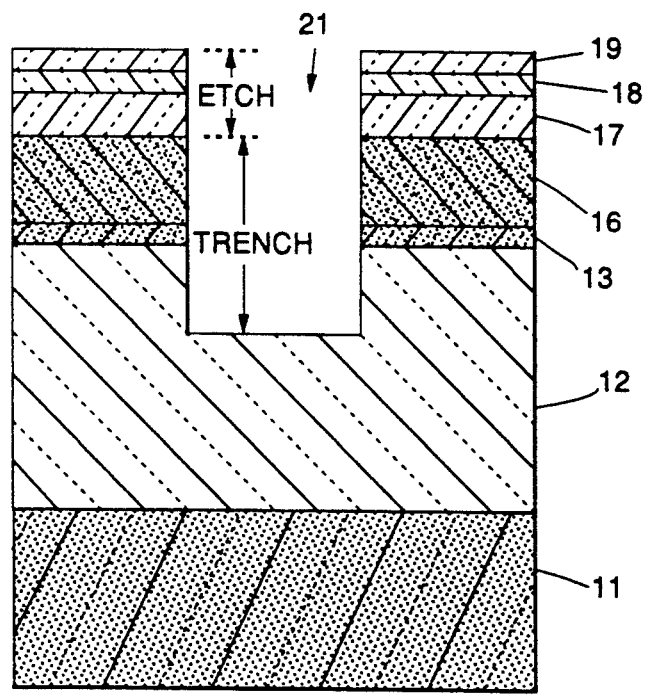

A trench mask 20 is formed over the surface of the transistor 10, and referring to FIG. 3, the trenches 21 are formed in the epitaxial layer of N silicon 12. The trenches 21 are etched using an anisotropic etching procedure which etches through the second oxide layer 19, the second layer of polysilicon 18, and the thick oxide layer 17, to the surface of the N+ polysilicon layer 16. A trencher is then used to trench into the N+ polysilicon layer 16 and into the epitaxial layer of N silicon 12. The anisotropic etching procedure produces a vertical sidewalls in the trenches 21. After etching the trenches 21, a post trench stripping procedure is used to remove the oxide on the sidewalls of the trenches 21. This stripping procedure may use diluted hydrofluoric acid, for example.

Figure 4:
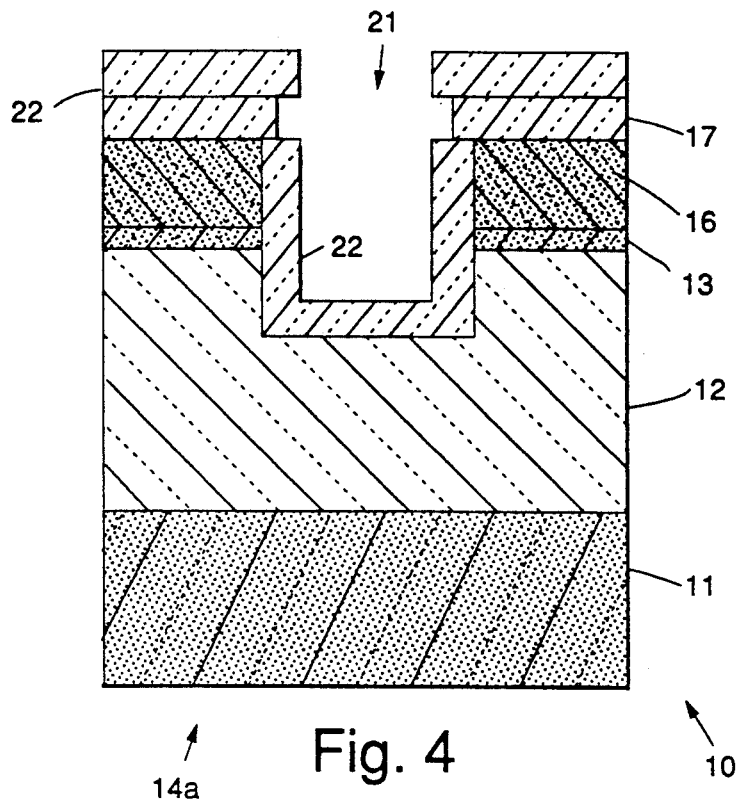

Referring to FIG. 4, after etching of the trenches 21 into the epitaxial layer of N silicon 12, a second layer of thermal oxide 22 is grown in the trenches 21, along the sidewalls of the trenches 21, and on top of the relatively thick oxide layer 17, which completely oxidizes the second layer of polysilicon 18. The oxidized second layer of polysilicon 18 is thus merged into the second layer of thermal oxide 22. The second layer of thermal oxide 22 is typically on the order of 6000 Å thick.

Figure 5:
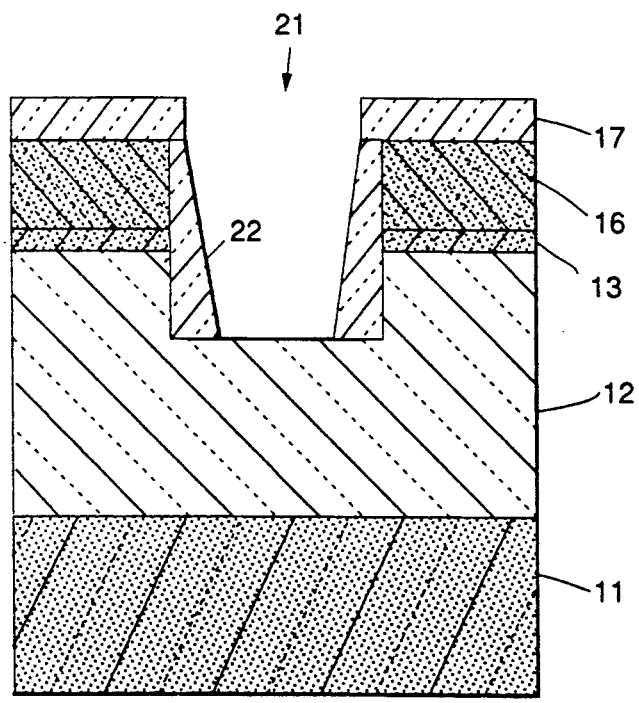

Referring to FIG. 5, the second layer of thermal oxide 22 is etched using an anisotropic dry etch, for example. This etching procedure tapers the sidewalls of the second layer of thermal oxide 22 along the sidewalls of the trenches 21. The topmost portion of the second layer of thermal oxide 22 is removed, the trench sidewalls are tapered, and the epitaxial layer of N silicon 12 is exposed at the bottom of the trenches 21.

Figure 6:
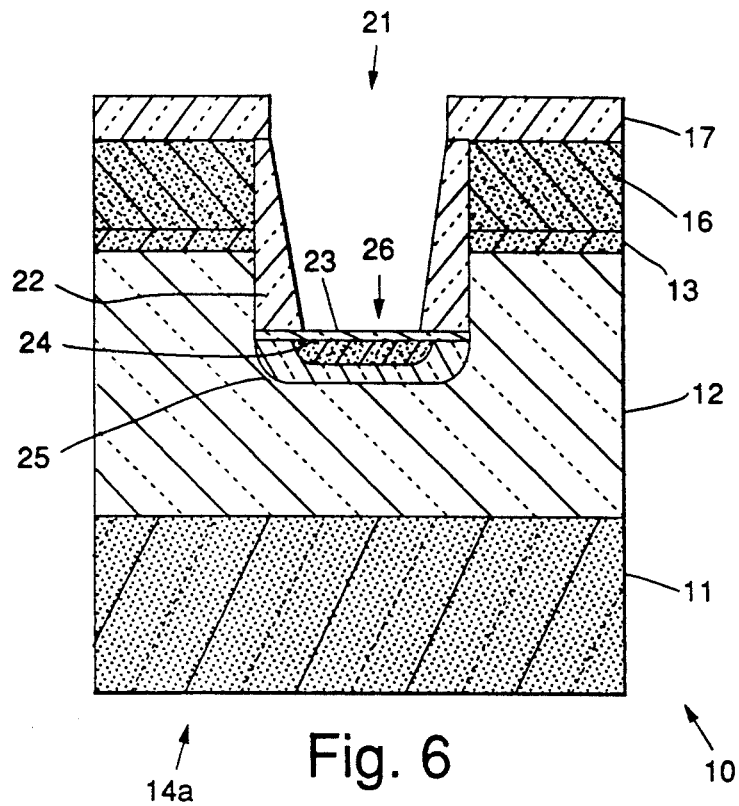

Referring to FIG. 6, a layer of gate oxide 23 is grown on top of the exposed layer of N silicon 12. The layer of gate oxide 23 is typically on the order of 210 Å thick. Then a P-grade implant and annealing procedure is performed to produce a P-grade layer 25. The annealing procedure occurs at a temperature of about 1050 degrees Celsius, for about 30 minutes. Then, P+ dopant ions are implanted into the P-grade layer 25 to form gate regions 26 of the transistor 10 and the transistor structure is annealed using a rapid thermal annealing procedure. The rapid thermal annealing occurs at a temperature of about 1100 degrees Celsius, for about 10 seconds. A wet oxide stripping procedure is then performed to strip the gate oxide layer 23 from the gate regions 26 of the transistor 10.

An important feature of the present invention is the variable sidewall trench oxide thickness provided the second layer of thermal oxide 22. The ability to provide for variable sidewall trench oxide thickness allows fabrication of static induction transistors 10 with higher or lower breakdown voltages according to the thickness that is chosen. A thicker layer of thermal oxide 22 along the sidewalls allows for a more graded P+ gate junction.

Figure 7:
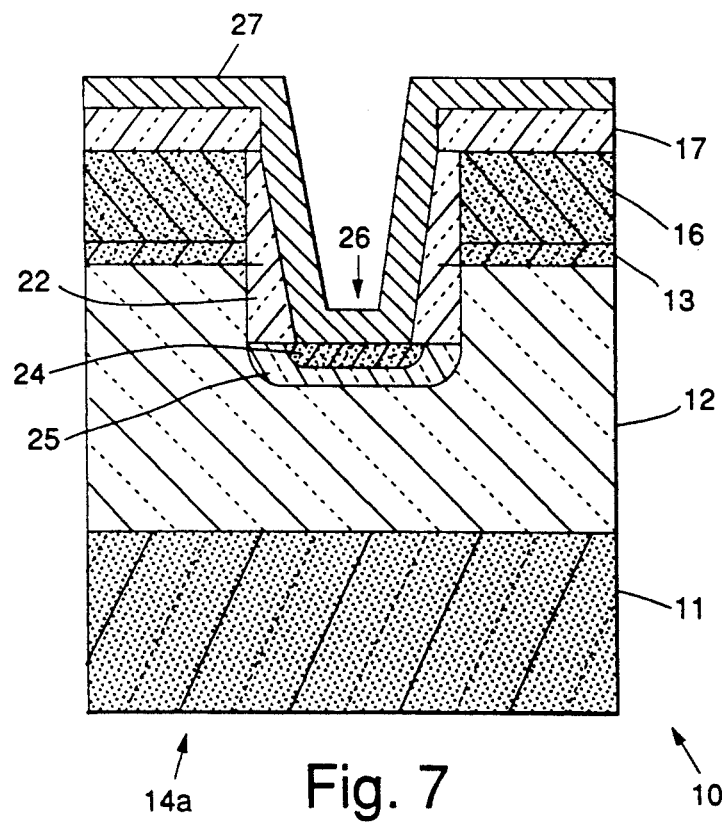
Figure 8:
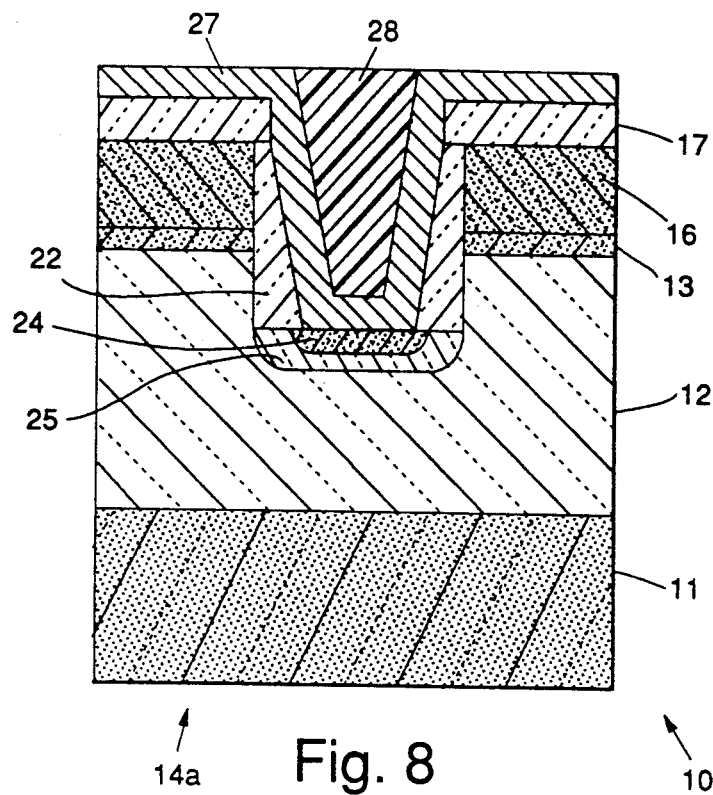

Referring to FIG. 7, a first layer of metal 27 is then deposited on top of the transistor 10 and into the trench 21 to make contact with the gate regions 26. The first layer of metal 27 is deposited to a thickness on the order of 5000 Å. Referring to FIG. 8, photoresist 28 is deposited over the top surface of the transistor 10, and the photo-resist 28 is planarized. Then, the first layer of metal 27 along with the planarized layer of photoresist 28 are planarized to produce the structure shown in FIG. 8.

Figure 9:
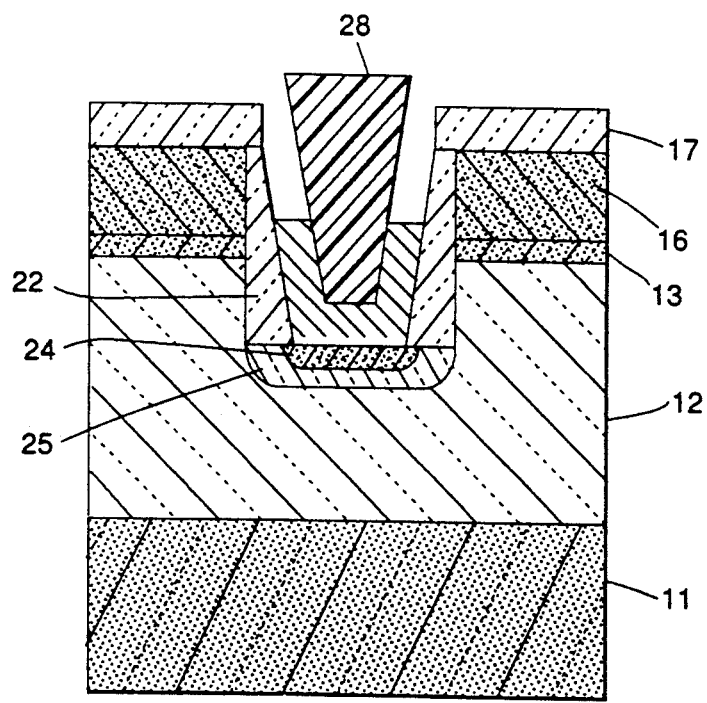
Figure 10:
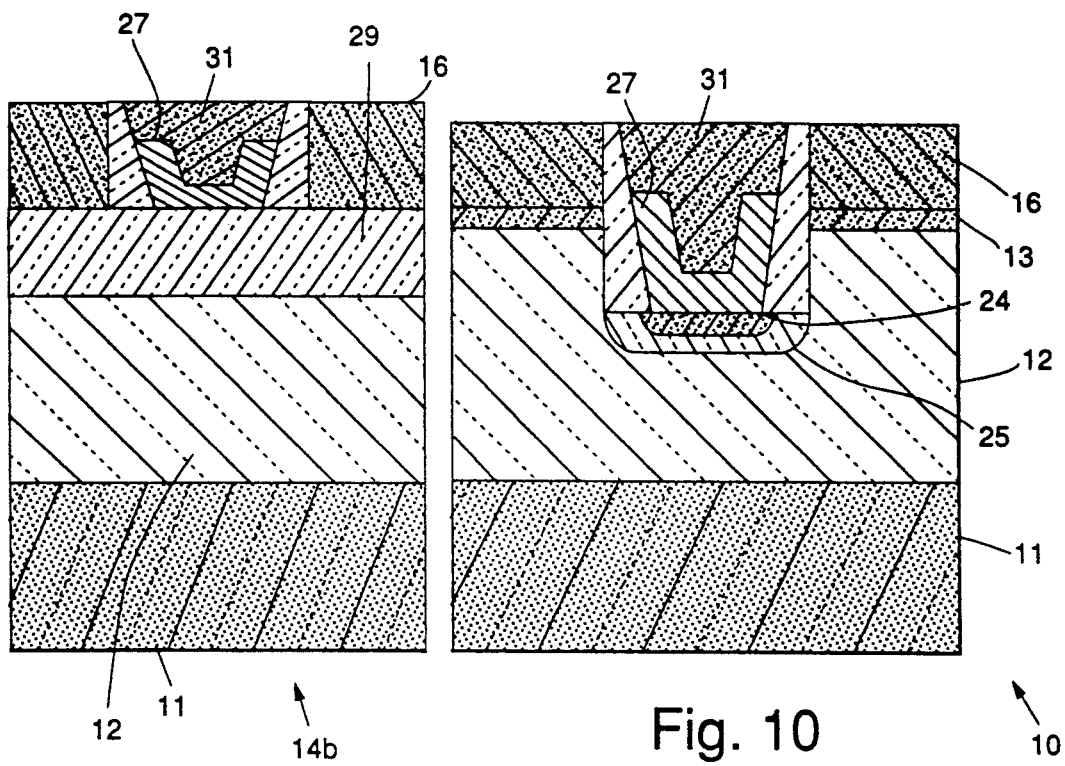

Referring to FIG. 9, the first layer of metal 27 is etched using a dry or wet etch, for example, to a predetermined depth below the top surface of the trench 21. The depth to which the metal is removed is not significant. This etching procedure produces the structure shown in FIG. 9. Referring to FIG. 10, the photoresist 28 is stripped from the transistor 10 using $O_2$ plasma, for example. Then, a plasma nitride layer 31 is deposited onto the top surface of the transistor 10. The plasma nitride layer 31 is then planarized. The polysilicon mask 32 (FIG. 1) is then deposited onto the top surface of the transistor 10, and the plasma nitride layer 31 and the polysilicon mask 32 are etched to expose the gate metal disposed on the field oxide. This produces the transistor structure shown in FIG. 10. An undoped oxide layer (not shown) is then deposited onto the top surface of the transistor 10 to a thickness on the order of 1000 Å, and a prepad mask 33 (FIG. 1) is formed over the undoped oxide layer and the oxide is etched and the mask is stripped.

Figure 11:
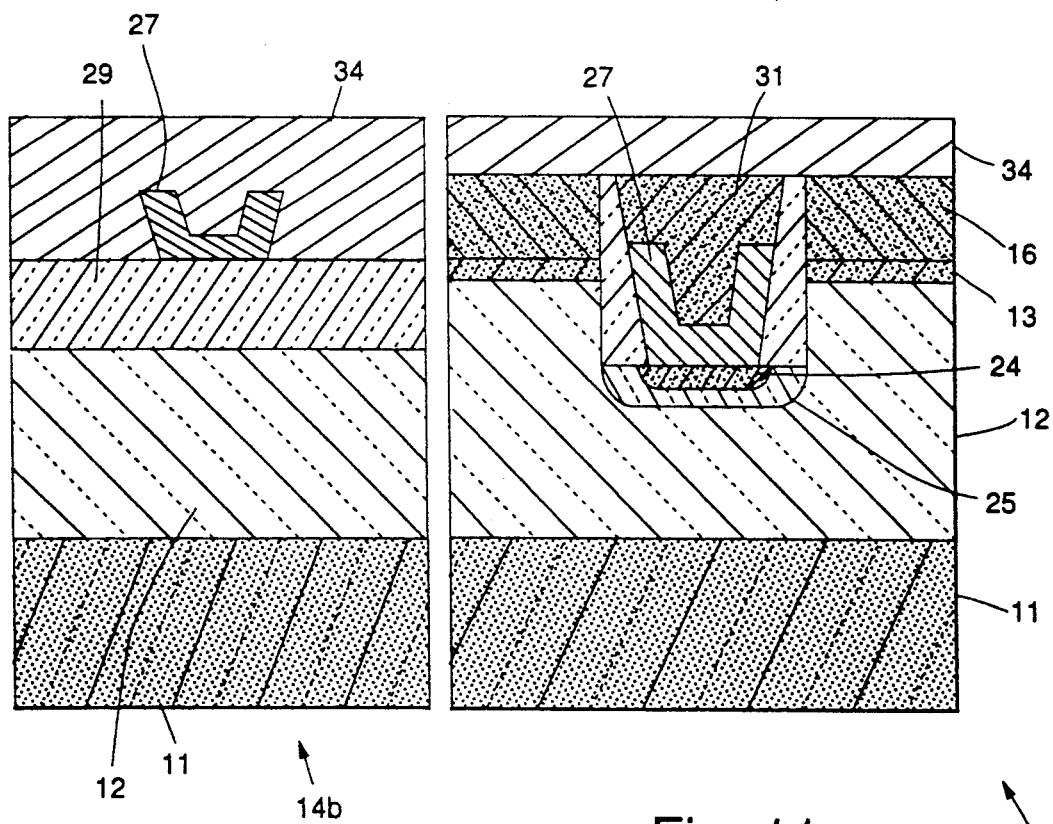

Referring to FIG. 11, a second metal layer 34 is then deposited on the top surface of the transistor 10. The second metal layer 34 connects to respective source and gate regions of the transistor 10. The second metal layer 34 is then masked using a metal mask (not shown) to form a metal pad. Next, a passivation layer (not shown) is deposited on top of the masked second metal layer 34. The passivation layer is masked using a passivation mask (not shown), and an interconnecting pad is formed by etching through the passivation layer. This completes fabrication of the transistor 10.

Figure 12:
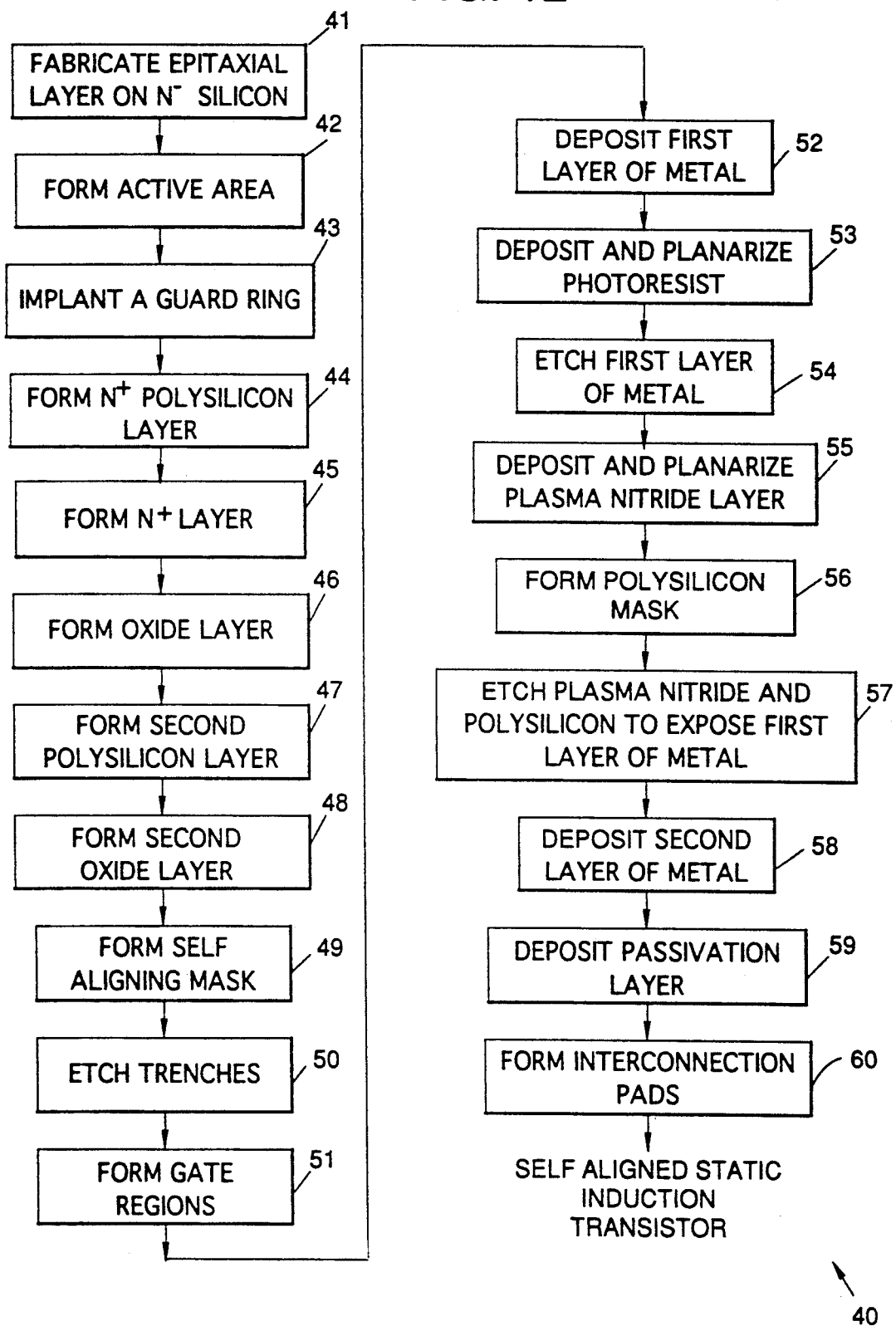
FIG. 12 is a flow diagram summarizing the steps in the method of the present invention.

Referring to FIG. 12, it shows a flow diagram summarizing the steps in the method 40 of the present invention. The processing steps are as follows. Fabricating an N silicon on N− silicon substrate 11, indicated in step 41. Forming an active area 14 on the substrate 11, indicated in step 42. Forming a guard ring 15 surrounding the active area 14, indicated in step 43. Forming an N+ polysilicon layer 16 on the substrate 11 that comprises source and gate regions of the transistor 10, indicated in step 44. Forming an N+ layer 13 on the N+ polysilicon layer 16, indicated in step 45. Forming an oxide layer 17 on top of the N+ polysilicon layer 16, indicated in step 46. Forming a second polysilicon layer 18 on top of the layer of oxide 17 indicated in step 47. Forming a second oxide layer 19 on top of the second polysilicon layer 18, indicated in step 48. Forming a self aligning mask 20 on the second oxide layer 19, indicated in step 49, and etching trenches 21 into the substrate 11 through the self aligning mask 20, indicated in step 50. Forming gate regions at the bottom of the trenches 21, indicated in step 51. Depositing a first layer of metal 17 to make contact with the gate regions 26, indicated in step 52. Depositing and planarizing a layer of photoresist 28 on the surface of the transistor 10, indicated in step 53. Etching the first layer of metal 27 to a predetermined depth below the top surface of the trenches 21, indicated in step 54. Depositing and planarizing a layer of plasma nitride 31 on the surface of the transistor 10, indicated in step 55. Forming a polysilicon mask 32 over the planarized layer of plasma nitride 31, indicated in step 56. Etching the top surface of the plasma nitride 31 and polysilicon layer 17 to expose the first layer of metal 27 in the field regions, indicated in step 57. Depositing a second layer of metal 34 on top of the transistor 10 to make contact with the source and gate regions, indicated in step 58. Depositing a passivation layer on top of the transistor 10, indicated in step 59. Forming interconnection pads that connect to the first and second layers of metal 27, 34, indicated in step 60.

In view of the above, it should be seen that the present method 40 provides for the fabrication of a self aligned static induction transistor, and the transistor 10 is fabricated using one minimum geometry mask (the trench mask 20). The present invention provides for higher transconductance and $f_t$ in the fabricated static induction transistor 10. In addition, the unity gain frequency, or cutoff frequency ($f_t$) of the fabricated static induction transistor 10 is increased, resulting in a faster speed of operation, on the order of several gigahertz. The present invention also provides for variable operational voltage by controlling the sidewall thickness of the trench 21.

Thus there has been described a new and improved method for fabricating self aligned static induction transistors. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A method of making a self aligned static induction transistor, said method comprising the steps of:

fabricating an N silicon on N− silicon substrate;
forming an active area on the substrate;
forming a guard ring surrounding the active area;
forming an N+ polysilicon layer on the substrate that comprises source and gate regions of the transistor;
forming an N+ layer adjacent the substrate;
forming an oxide layer on top of the N+ polysilicon layer;
forming a second polysilicon layer on the oxide layer;
forming a second oxide layer on top of the second polysilicon layer;
forming a self aligning mask on top of the second oxide layer;
etching trenches into the substrate using the self aligning mask;
forming gate regions at the bottom of the trenches;
depositing a first layer of metal on top of the transistor to make contact with the gate regions;
depositing and planarizing a layer of photoresist on the surface of the transistor;
overetching the first layer of metal to a predetermined depth below the top surface of the trench;
removing the layer of photoresist;
depositing and planarizing a layer of plasma nitride on the surface of the transistor;
forming a polysilicon mask over the planarized layer of plasma nitride;
etching the top surface of the transistor to expose the first layer of metal disposed over field regions of the transistor;
depositing a second layer of metal on top of the transistor to make contact with the source and gate regions;
depositing a passivation layer on top of the transistor; and
forming interconnection pads that connect the first and second layers of metal.

2. The method of claim 1 wherein the step of etching trenches comprises the step of anisotropically etching the trenches into the substrate to produce relatively vertical walls of the trenches.

3. The method of claim 1 wherein the step of forming an N+ layer adjacent the substrate comprises the steps of:

depositing a layer of silicon nitride on the N+ polysilicon; and
diffusing N+ dopant ions through the N+ polysilicon layer and into the substrate.

4. The method of claim 1 wherein the step of forming gate regions at the bottom of the trenches comprises the steps of:

growing gate oxide in the trenches;
forming a P-grade layer adjacent the bottom of the trenches; and
depositing P+ dopant ions are implanted into the P-grade layer to form the gate regions.

5. The method of claim 4 wherein the step of depositing P+ dopant ions comprises the steps of:

implanting P+ dopant ions into the P-grade layer; and
annealing the implanted P-grade layer.

6. The method of claim 1 wherein the step of etching the trenches comprises providing for variable sidewall trench oxide thickness to provide for higher or lower breakdown voltages according to the thickness, and wherein a thicker layer of thermal oxide along the sidewalls allows for a more graded P+ gate junction.

7. The method of claim 1 wherein the step of overetching the first layer of metal comprises overetching the first layer of metal by a factor of 100 to 300 percent.

* * * * *